United States Patent [19]

Nakamura et al.

[11] Patent Number: 5,043,944
[45] Date of Patent: Aug. 27, 1991

[54] SEMICONDUCTOR MEMORY DEVICE WITH IMPROVED OUTPUT TO DIFFERENTIAL DATA LINES

[75] Inventors: Kenichi Nakamura, Tokyo; Makoto Segawa, Yokohama, both of Japan

[73] Assignee: Kabushiki Kaisha Toshiba, Kawasaki, Japan

[21] Appl. No.: 611,056

[22] Filed: Nov. 9, 1990

[30] Foreign Application Priority Data

Nov. 10, 1989 [JP] Japan .................................. 1-292992

[51] Int. Cl.$^5$ ................................................ G11C 7/00
[52] U.S. Cl. .............................. 365/189.05; 365/190; 365/194; 365/203; 365/204; 365/230.08; 365/233.5; 307/473
[58] Field of Search ...................... 365/189.05, 230.08, 365/190, 203, 204, 194; 307/233.5, 473

[56] References Cited
U.S. PATENT DOCUMENTS

| | | | |
|---|---|---|---|
| 4,573,147 | 2/1986 | Aoyama et al. | 365/230.08 |
| 4,603,403 | 7/1986 | Toda | 365/190 |
| 4,620,298 | 10/1986 | Ozawa | 365/230.08 |
| 4,817,054 | 3/1989 | Banerjee et al. | 365/230.08 |
| 4,843,595 | 6/1989 | Suzuki | 365/190 |
| 4,881,203 | 11/1989 | Watanabe et al. | 365/203 |

*Primary Examiner*—Joseph E. Clawson, Jr.
*Attorney, Agent, or Firm*—Foley & Lardner

[57] ABSTRACT

A semiconductor memory device includes a memory cell array having a plurality of memory cells, each of the cells being capable of storing a data and being selected by an address; a pair of data lines to which a pair of complementary data from a selected memory cell are imputted; an equalizer for short-circuiting and equalizing the pair of data lines when an equalizing signal is applied; an output circuit for outputting a single signal corresponding to the pair of complementary data from the pair of data lines; a pair of latch circuits provided between the output circuit and the equalizer for the pair of data lines, the pair of latch circuits holding the pair of complementary data; a pair of output buffer circuit provided between the pair of latch circuits and the equalizer for the pair of data lines, the pair of output buffer circuits capable of taking a low impedance state wherein the potentials per se of the pair of data lines are outputted, and a high impedance state wherein the potential change of the pair of data lines is not transmitted to the output side of the pair of output buffer circuits; and a controller for generating a first control signal which makes the pair of output buffer circuits to enter the high impedance state before the equalizing signal is applied to the equalizer and a second control signal which makes the pair of output buffer circuits to enter the low impedance state after the equalizing signal is turned off.

12 Claims, 10 Drawing Sheets

5,043,944

SEMICONDUCTOR MEMORY DEVICE WITH IMPROVED OUTPUT TO DIFFERENTIAL DATA LINES

FIELD OF THE INVENTION

The present invention relates to a semiconductor memory device, and more particularly to a semiconductor memory device characterized in its output circuit portion.

BACKGROUND OF THE INVENTION

FIG. 1 is a circuit diagram of a semiconductor device of the background art, showing an example of the structure of a semiconductor memory, particularly of its output buffer circuit portion. Referring to FIG. 1, a memory cell array MCA has a plurality of memory cells MC each capable of storing a data. An address Ai selects one memory cell MC. A data in the selected memory cell MC is outputted as complementary data and inputted via data lines D and $\overline{D}$ to an output buffer OB. Specifically the complementary data is supplied via output gate circuits OG1 and OG2 to output transistors Tr1 and Tr2. An on/off of the output gate circuits OG1 and OG2 is controlled by an output enable signal $\overline{OE}$. An equalizing transistor Tr0 is connected between the data lines D and $\overline{D}$. This transistor Tr0 equalizes the data lines D and $\overline{D}$ upon reception of an equalizing signal $\overline{\phi}_{Eq}$ temporarily inputted at the time of address transition. The transistors Tr1 and Tr2 operate in a complementary manner. An output signal from the interconnection between the transistors Tr1 and Tr2 is transferred to an I/O pin.

The operation of the semiconductor device constructed as above will be described below.

Complementary output signals from a selected memory cell MC are outputted onto the data lines D and $\overline{D}$. As an address transits and a different memory cell is selected, output signals from the memory cell cause the data level of the data lines D and $\overline{D}$ to change. In order to allow high speed access to a memory cell, the data lines D and $\overline{D}$ are equalized. The transistor Tr0 is used for this purpose. When the equalizing signal $\overline{\phi}_{Eq}$ is applied to the transistor Tr0, the data lines D and $\overline{D}$ are equalized to an intermediate level between $V_{CC}$ and $V_{SS}$. In this case, in order to prevent a through current from flowing from the power source $V_{CC}$ to the power source $V_{SS}$ via the output transistors Tr1 and Tr2, the output gate circuits OG1 and OG2 are both closed by the output enable signal $\overline{OE}$ so that the output transistors Tr1 and Tr2 are turned off at the same time. The I/O pin therefore becomes high impedance. Next, after the data lines D and $\overline{D}$ are fully equalized and the output data from the selected memory cell is established, the output gate circuits OG1 and OG2 are opened by the output enable signal $\overline{OE}$. Then, the data on the data lines D and $\overline{D}$ is supplied to the gates of the transistors Tr1 and Tr2 via the output gate circuits OG1 and OG2. As a result, one of the transistors Tr1 and Tr2 turns on and the other turns off, so that the data is outputted from the memory circuit to the I/O pin.

During such operations described above, a circuit for detecting an address transition of the memory circuit sometimes operates erroneously because of fluctuations of the power supply voltage. For example, there occurs a case that the equalizing signal $\overline{\phi}_{Eq}$ is outputted erroneously for a very short time. As a result, the transistor Tr0 turns on erroneously and the data lines D and $\overline{D}$ are equalized. This erroneous equalization causes a temporary unstable state of the potentials at the data lines D and $\overline{D}$, i.e., the input voltages to the two gates of the transistors Tr1 and Tr2. In other words, if the erroneous equalization occurs when the output data on the data lines D and $\overline{D}$ is changing in accordance with the outputs from a newly selected memory cell, the establishment of the output data is temporarily stopped. Data output from the output transistors Tr1 and Tr2 to the I/O pin is therefore delayed, hindering high speed access.

A semiconductor device shown in FIG. 2 has been proposed for solving the above problem. As shown in FIG. 2, latch circuits L1 and L2 are provided at the gate side of the output transistors Tr1 and Tr2. The latch circuits L1 and L2 prevent the gate inputs to the output transistors Tr1 and Tr2 from entering an unstable state by noise which operates in the same manner as the equalizing signal $\overline{\phi}_{Eq}$. Particularly, the latch circuits L1 and L2 hold the gate input state so that a data output delay can be avoided. Furthermore, the output buffers connected to the output transistors Tr1 and Tr2 are constructed of tri-state buffers. With such an arrangement, while the data lines D and $\overline{D}$ are equalized by an output from a buffer control circuit BC, the buffer control circuit BC outputs signals for controlling the output buffer circuits B1 and B2 such that the outputs supplied to the gates of the output transistors Tr1 and Tr2 from the circuits B1 and B2 are made high impedance. In this case, if the output enable signal OE is not inputted to the buffer control circuit BC, it is apparent that the output buffer circuits B1 and B2 turn off the gates of the output transistors Tr1 and Tr2. However, on the other hand, if the output enable signal $\overline{OE}$ is inputted to the buffer control circuit BC, the output buffer circuits B1 and B2 allow the levels per se at the data lines D and $\overline{D}$ to be supplied to the gates of the output transistors Tr1 and Tr2. In this condition, if the equalizing signal $\overline{\phi}_{Eq}$ is inputted to the buffer control circuit BC, outputting the output enable signal $\overline{OE}$ is inhibited so that the outputs of the output buffer circuits B1 and B2 are made high impedance. Consequently, the gate potentials of the output transistors Tr1 and Tr2 are held at the data in the latch circuits L1 and L2.

With the circuit arrangement shown in FIG. 2, even if a noise signal operating as the equalizing signal $\overline{\phi}_{Eq}$ is inputted, the outputs of the output transistors are not prevented from being established, thereby allowing a rapid establishment of output data at the I/O pin.

The operation of the two semiconductor devices shown in FIGS. 1 and 2 will further be detailed below.

The circuit operation of the semiconductor device shown in FIG. 1 for reading a "0" level to be changed from a "1" level from a memory cell MC will be described with reference to the timing charts shown in FIGS. 3A to 3F. FIG. 3A shows a change in potential of the equalizing signal $\overline{\phi}_{Eq}$ with time, FIG. 3B shows a change in the potential of the data lines D and $\overline{D}$ with time, FIG. 3C shows a change in gate potential of the output transistors Tr1 and Tr2 with time, FIG. 3D shows a change in potential at the I/O pin connected to the interconnection between the output transistors Tr1 and Tr2 with time, FIG. 3E shows a change in $V_{CCin}$ and $V_{SSin}$ within the chip of the semiconductor circuit, and FIG. 3F shows a change in potential of the external input to an address buffer from the outside of the chip with time, relative to the reference potential of $V_{SSin}$ within the semiconductor circuit.

As shown in FIG. 3F, consider the case where a voltage inputted to an address buffer (not shown) changes from a lower voltage to a higher voltage than a threshold value $V_{thADB}$ of the buffer circuit. When the buffer circuit operates, the equalizing signal $\overline{\phi}_{Eq}$ temporarily takes a "0" level at time t1 so that the data lines D and $\overline{D}$ are equalized to take an intermediate level. Next, the output gate circuits OG1 and OG2 detect the intermediate level as $V_{IH}$ and cause the gate potentials $V_{GTr1}$ and $V_{GTr2}$ of the output transistors Tr1 and Tr2 to take a "0" level. Both the output transistors Tr1 and Tr2 therefore turn off. Next at time t2 the equalization terminates and a newly read-out data reaches so that the data line D changes from a "1" level to "0" level whereas the data line $\overline{D}$ changes from a "0" level to "1" level. As a result, the gate level $V_{GTr2}$ of the output transistor Tr2 takes a "1" level and is turned on. The transistor Tr1 remains in an off-state. Therefore, a large current flows via the transistor Tr2 from the I/O pin to the inside of the semiconductor circuit chip, resulting in a temporal rise of the power supply voltages $V_{CCin}$ and $V_{SSin}$ within the chip by $\Delta V$. Accordingly, the potential $V_{in}$ of the input signal to the address buffer has a potential difference from the voltage $V_{SSin}$ within the chip, i.e., becomes lower than the latter by $\Delta V$.

If the input potential $V_{in}$ has at first a potential higher than the address buffer circuit threshold value $V_{thADB}$ by the amount smaller than $\Delta V$, the address buffer falsely and temporarily considers the input potential not as the real $V_{IH}$ but as the $V_{IL}$, resulting in an erroneous operation. Therefore, the equalizing signal $\overline{\phi}_{Eq}$ again takes a "0" level at time t3 which causes the data lines D and $\overline{D}$ to take the intermediate level. As a result, in the similar manner as above, the gate potentials inputted to the output transistors Tr1 and Tr2 change from a "1" level to "0" level so that both the transistors Tr1 and Tr2 turn off, temporarily intercepting electric discharge from the I/O pin to the inside of the chip. The electric discharge resumes at time t4. From the above reason, data reading speed delays.

Next, the circuit operation of the semiconductor device shown in FIG. 1 for reading a "1" level to be changed from a "0" level from a memory cell MC will be described with reference to the timing charts shown in FIGS. 4A to 4F. FIG. 4A shows a change in potential of the equalizing signal $\overline{\phi}_{Eq}$ with time, FIG. 4B shows a change in potential of the data lines D and $\overline{D}$ with time, FIG. 4C shows a change in gate potential of the output transistors Tr1 and Tr2 with time, FIG. 4D shows a change in potential at the I/O pin connected to the interconnection between the output transistors Tr1 and Tr2 with time, FIG. 4E shows a change in $V_{CCin}$ and $V_{SSin}$ within the chip of the semiconductor circuit, and FIG. 4F shows a change in potential of the external input to an address buffer from the outside of the chip with time, relative to the reference potential of $V_{SSin}$ within the semiconductor circuit.

As shown in FIG. 4F, consider the case where a voltage inputted to an address buffer (not shown) changes from a higher voltage to a lower voltage than a threshold value $V_{thADB}$ of the buffer circuit. When the buffer circuit operates, the equalizing signal $\overline{\phi}_{Eq}$ temporarily takes a "0" level at time t1 so that the data lines D and $\overline{D}$ are equalized to take an intermediate level. Next, the output gate circuits OG1 and OG2 detect the intermediate level as $V_{IH}$ and cause the gate potentials $V_{GTr1}$ and $V_{GTr2}$ of the output transistors Tr1 and Tr2 to take a "0" level. Both the output transistors Tr1 and Tr2 therefore turn off. Next at time t2 the equalization terminates and a newly read-out data reaches so that the data line D changes from a "0" level to "1" level whereas the data line $\overline{D}$ changes from a "1" level to "0" level. As a result, the gate level $V_{GTr1}$ of the output transistor Tr1 takes a "1" level and is turned on. The transistor Tr2 remains in an off-state. Therefore, a large current flows via the transistor Tr1 from the I/O pin to the inside of the semiconductor circuit chip, resulting in a temporal fall of the power supply voltages $V_{CCin}$ and $V_{SSin}$ within the chip by $\Delta V$. Accordingly, the potential $V_{in}$ of the input signal to the address buffer has a potential difference from the voltage $V_{SSin}$ within the chip, i.e., becomes higher than the latter by $\Delta V$.

If the input potential $V_{in}$ has at first a potential lower than the address buffer circuit threshold value $V_{thADB}$ by the amount smaller than $\Delta V$, the address buffer falsely and temporarily considers the input potential not as the real $V_{IL}$ but as the $V_{IH}$, resulting in an erroneous operation. Therefore, the equalizing signal $\overline{\phi}_{Eq}$ again takes the "0" level at time t3 which causes the data lines D and $\overline{D}$ to take the intermediate level. As a result, in the similar manner as above, the gate potentials inputted to the output transistors Tr1 and Tr2 change from a "1" level to the "0" level so that both the transistors Tr1 and Tr2 turn off, temporarily intercepting electric charge from the inside of the chip to the I/O pin via the transistor Tr1. The electric charge resumes at time t4. For the above reason, the data reading speed is reduced.

The circuit shown in FIG. 2 has been proposed to solve the above problems. With the circuit shown in FIG. 2, even if noises operating in the same manner as the equalizing signal $\overline{\phi}_{Eq}$ are generated at the time of address transition, the gate potentials of the output transistors Tr1 and Tr2 are being held by the latch circuit L1 and L2, preventing a delay in circuit operations.

Next, the circuit operation of the semiconductor device shown in FIG. 2 for reading the "0" level to be changed from the "1" level from a memory cell MC will be be described with reference to the timing charts shown in FIGS. 5A to 5F. FIG. 5A shows a change in potential of the equalizing signal $\overline{\phi}_{Eq}$ with time, FIG. 5B shows a change in potential of the data lines D and $\overline{D}$ with time, FIG. 5C shows a change in gate potential of the output transistors Tr1 and Tr2 with time, FIG. 5D shows a change in potential at the I/O pin connected to the interconnection between the output transistors Tr1 and Tr2 with time, FIG. 5E shows a change in $V_{CCin}$ and $V_{SSin}$ within the chip of the semiconductor circuit, and FIG. 5F shows a change in potential of the external input to an address buffer from the outside of the chip with time, relative to the reference potential of $V_{SSin}$ within the semiconductor circuit.

As shown in FIG. 5F, consider the case where a voltage inputted to an address buffer (not shown) changes from a lower voltage to a voltage higher than a threshold value $V_{thADB}$ of the buffer circuit. When the buffer circuit operates, the equalizing signal $\overline{\phi}_{Eq}$ temporarily takes the "0" level at time t1 so that a p-channel transistor Tr0 turns on to equalize the data lines D and $\overline{D}$ which in turn take an intermediate level. While the equalizing signal $\overline{\phi}_{Eq}$ takes the "0" level, the output buffer circuits B1 and B2 which control the gate potentials $V_{GTr1}$ and $V_{GTr2}$ of the output transistors, enter a high impedance state. As a result, the latch circuits L1 and L2 hold the previous gate potentials. Next, the equalization terminates at time t2 and the equalizing signal takes $\overline{\phi}_{Eq}$ the "1" level. Therefore, the output buffer circuits B1 and B2 enter a low impedance state. The output buffer circuits B1 and B2 detect the intermediate level as $V_{IH}$ and cause the gate potentials $V_{GTr1}$ and $V_{GTr2}$ of the output transistors Tr1 and Tr2 to change from the "1" level to the "0" level. Next, a newly read-out data reaches the data lines D and $\overline{D}$. Namely, the data line D changes from the "1" level to the "0" level whereas the data line $\overline{D}$ changes from the "0" level to "1" level. As a result, the gate levels $V_{GTr1}$ and $V_{GTr2}$ of the output transistors Tr1 and Tr2 take the "0" level and the "1" level, respectively, turning off the output transistor Tr1 and turning on the output transistor Tr2. Therefore, a large current flows from the I/O pin to the inside of the semiconductor circuit chip, resulting in a temporary rise of the power supply voltages $V_{CCin}$ and $V_{SSin}$ within the chip by $\Delta V$. Accordingly, the potential $V_{in}$ of the input signal to the address buffer has a potential difference from the voltage $V_{SSin}$ within the chip, i.e., becomes higher than the latter by $\Delta V$, when compared with the case before the large current flows from the I/O pin to the inside of the semiconductor circuit chip.

If the input potential $V_{in}$ has at first a potential higher than the address buffer circuit threshold value $V_{thADB}$ by the amount smaller than $\Delta V$, the address buffer falsely and temporarily considers the input potential as $V_{IH}$, resulting in an erroneous operation. Therefore, the equalizing signal $\overline{\phi}_{Eq}$ again takes the "0" level at time t3 which causes the data lines D and $\overline{D}$ to take the intermediate level. In this case however, since the output buffer circuits B1 and B2 are in the high impedance state, the gate potentials of the output transistors Tr1 and Tr2 are being held at the "0" level and "1" level, respectively, by the latch circuits L1 and L2.

The output buffer circuits B1 and B2 however enter a low impedance state when the equalizing signal $\overline{\phi}_{Eq}$ takes the "1" level at time t4. Therefore, the output buffer circuit B2 detects the intermediate level at the data line as $V_{IH}$ to that the gate potential of the output transistor Tr2 take the "0" level. As a result, during the period from when a newly read-out data again reaches the data lines D and $\overline{D}$ to when the gate potential of the output transistor Tr2 again takes the "1" level, electric discharge from the I/O pin to the inside of the chip is intercepted, resulting in a delay in the data reading speed.

Next, the circuit operation of the semiconductor device shown in FIG. 2 for reading the "1" level to be changed from the "0" level from a memory cell MC of the memory cell array MCA will be described with reference to the timing charts shown in FIGS. 6A to 6F. FIG. 6A shows a change in potential of the equalizing signal $\overline{\phi}_{Eq}$ with time, FIG. 6B shows a change in potential of the data lines D and $\overline{D}$ with time, FIG. 6C shows a change in gate potential of the output transistors Tr1 and Tr2 with time, FIG. 6D shows a change in potential at the I/O pin connected to the interconnection between the output transistors Tr1 and Tr2 with time, FIG. 6E shows a change in $V_{CCin}$ and $V_{SSin}$ within the chip of the semiconductor circuit, and FIG. 6F shows a change in potential of the external input to an address buffer from the outside of the chip with time, relative to the reference potential of $V_{SSin}$ within the semiconductor circuit.

As shown in FIG. 6F, consider the case where a voltage inputted to an address buffer (not shown) changes from a higher voltage to a lower voltage than a threshold value $V_{thADB}$ of the buffer circuit. When the buffer circuit operates, the equalizing signal $\overline{\phi}_{Eq}$ temporarily takes a "0" level at time t1 so that the p-channel transistor Tr0 turns on to equalize the data lines D and $\overline{D}$ which in turn take an intermediate level. While the equalizing signal $\overline{\phi}_{Eq}$ takes the "0" level, the output buffer circuits B1 and B2 which control the gate potentials $V_{GTr1}$ and $V_{GTr2}$ of the output transistors, enter a high impedance state. As a result, the latch circuits L1 and L2 hold the previous gate potentials. Next, the equalization terminates at time t2 and the equalizing signal $\overline{\phi}_{Eq}$ takes the "1" level. Therefore, the output buffer circuits B1 and B2 enter a low impedance state. The output buffer circuits B1 and B2 detect the intermediate level as $V_{IH}$ and cause the gate potentials $V_{GTr1}$ and $V_{GTr2}$ of the output transistors Tr1 and Tr2 to change from the "1" level to a "0" level. Next, a newly read-out data reaches the data lines D and $\overline{D}$. Namely, the data line D changes from the "0" level to the "1" level whereas the data line $\overline{D}$ changes from the "1" level to the "0" level. As a result, the gate levels $V_{GTr1}$ and $V_{GTr2}$ of the output transistors Tr1 and Tr2 take the "1" level and the "0" level, respectively, turning on the output transistor Tr1. Therefore, a large current flows from the inside of the semiconductor circuit chip to the I/O pin via the output transistor Tr1, resulting in a temporary fall of the power supply voltages $V_{CCin}$ and $V_{SSin}$ within the chip by $\Delta V$. Accordingly, the potential $V_{in}$ of the input signal to the address buffer has a potential difference from the voltage $V_{SSin}$ within the chip, i.e., becomes higher than the latter by $\Delta V$, as compared with the case before the large current flows from the inside of the chip to the I/O pin.

If the input potential $V_{in}$ has at first a potential lower than the address buffer circuit threshold value $V_{thADB}$ by the amount smaller than $\Delta V$, the address buffer falsely and temporarily considers the input potential as $V_{IH}$, resulting in an erroneous operation. Therefore, the equalizing signal $\overline{\phi}_{Eq}$ again takes a "0" level at time t3 which causes the data lines D and $\overline{D}$ to take the intermediate level. In this case however, since the output buffer circuits B1 and B2 are in the high impedance state, the gate potentials $V_{GTr1}$ and $V_{GTr2}$ of the output transistors Tr1 and Tr2 are being held at the "1" level and the "0" level, respectively, by the latch circuits L1 and L2.

The output buffer circuits B1 and B2 however enter a low impedance state when the equalizing signal $\overline{\phi}_{Eq}$ takes the "1" level at time t4. Therefore, the output buffer circuit B1 detects the intermediate level at the data line $\overline{D}$ as $V_{IH}$ so that the gate potential $V_{GTr1}$ of the output transistor Tr1 take the "0" level. As a result, during the period from when a newly read-out data again reaches the data lines D and $\overline{D}$ to when the gate potential $V_{GTr1}$ of the output transistor Tr1 again takes the "1" level, electric charge from the inside of the chip to the I/O pin is intercepted, resulting in a delay of data reading speed.

Semiconductor devices of the background art have been heretofore constructed as described above. If there is not a sufficient potential difference between the potential of an external input signal such as an address signal and a threshold value of a buffer circuit for receiving such an external input signal, data reading speed delays because of variations of the level of the power supply voltage or ground voltage within the semiconductor circuit chip, raising an obstacle against high speed access to a memory circuit.

SUMMARY OF THE INVENTION

The present invention has been made in consideration of the above circumstances, and aims at providing a semiconductor memory device capable of preventing a delay of data reading time and realizing high speed circuit operation even if there is a level variation of a power supply voltage and ground voltage.

A semiconductor memory device of this invention is constructed of the following elements:

a memory cell array having a plurality of memory cells each capable of storing a data and being selected by an address;

a pair of data lines to which a pair of complementary data from a selected memory cell are inputted;

equalizing means for short-circuiting and equalizing the pair of data lines when an equalizing signal is applied;

output means for outputting a single signal corresponding to the pair of complementary data from the pair of data lines;

a pair of latch means provided between the output means and the equalizing means for the pair of data lines, the pair of latch means holding the pair of complementary data;

a pair of output buffer means provided between the pair of latch means and the equalizing means for the pair of data lines, the pair of output buffer means capable of taking a low impedance state wherein the potentials per se of the pair of data lines are outputted, and a high impedance state wherein the potential change of the pair of data lines is not transmitted to the output side of the pair of output buffer means; and control means for generating a first control signal which makes the pair of output buffer means enter the high impedance state before the equalizing signal is applied to the equalizing means and a second control signal which makes the pair of output buffer means to enter the low impedance state after the equalizing signal is turned off.

DESCRIPTION OF THE PREFERRED EMBODIMENTS

An embodiment of the semiconductor device of this invention will be described with reference to the accompanying drawings.

Figure 1:
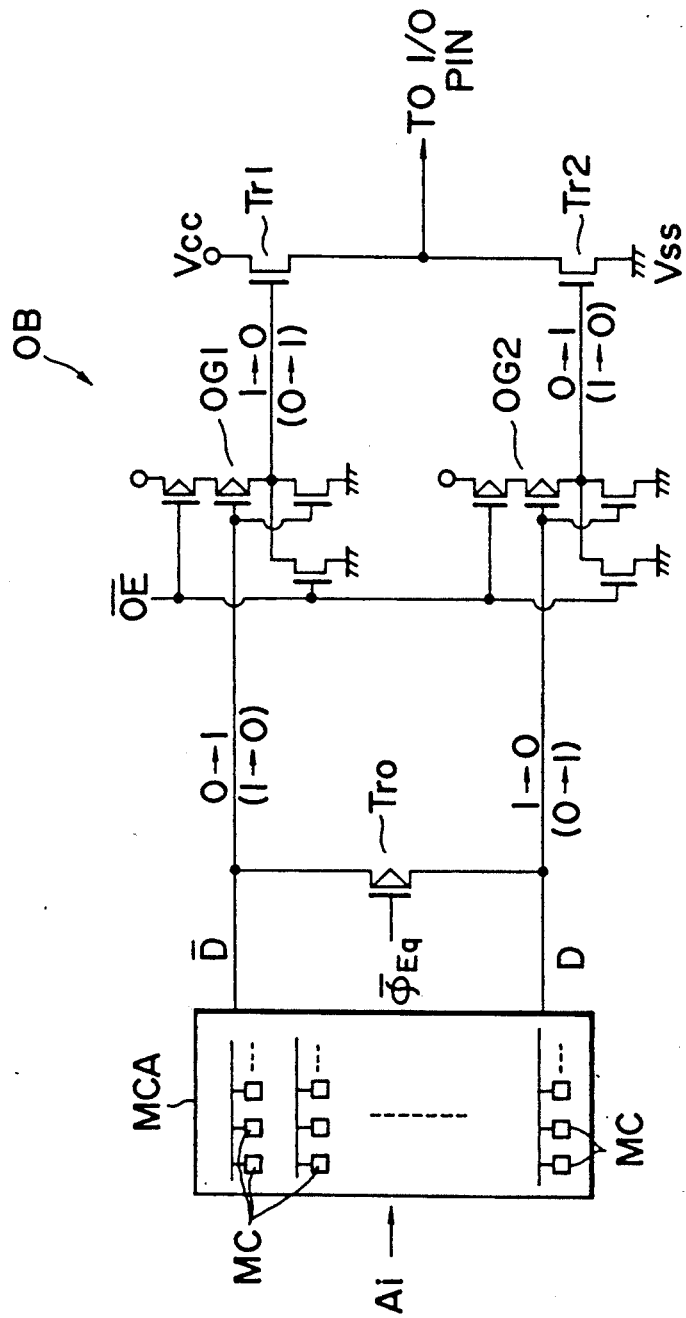
FIG. 1 is a circuit block diagram of a semiconductor device of the background art.
Figure 2:
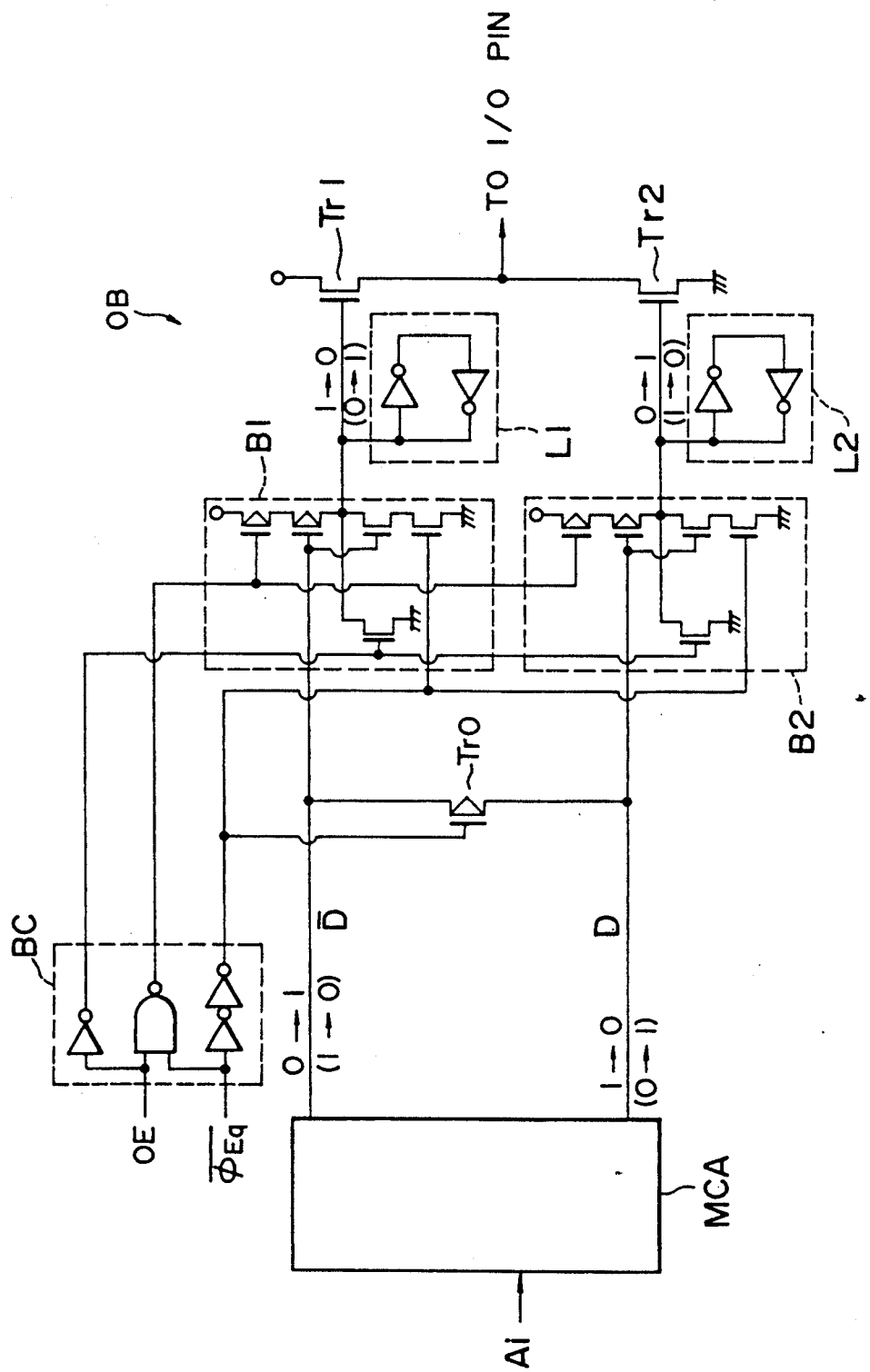
FIG. 2 is a circuit block diagram of another semiconductor device of the background art.
Figure 3A:
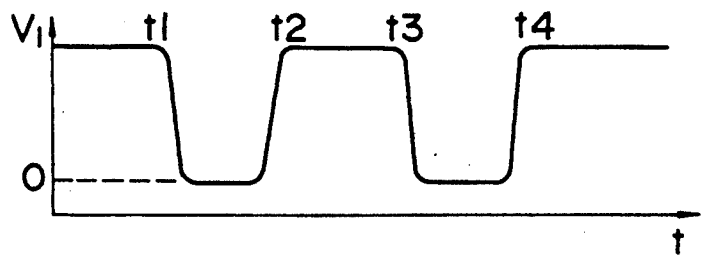
FIGS. 3A to 3F and FIGS. 4A to 4F are timing charts used for explaining the operation of the semiconductor device shown in FIG. 1.
Figure 3B:
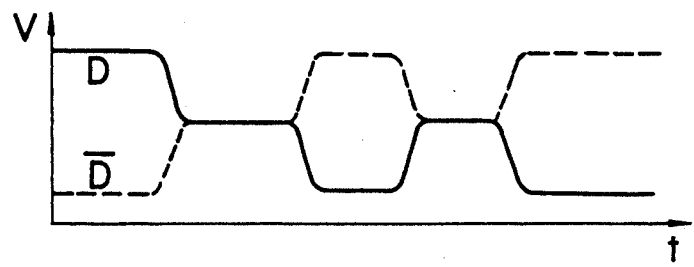
Figure 3C:
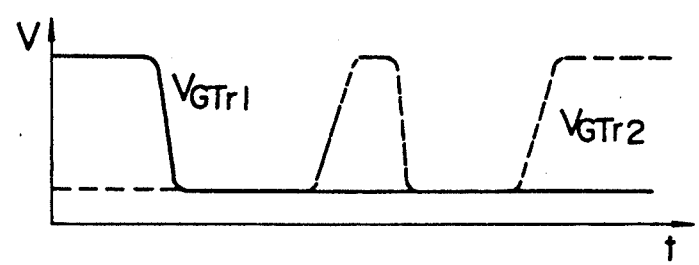
Figure 3D:
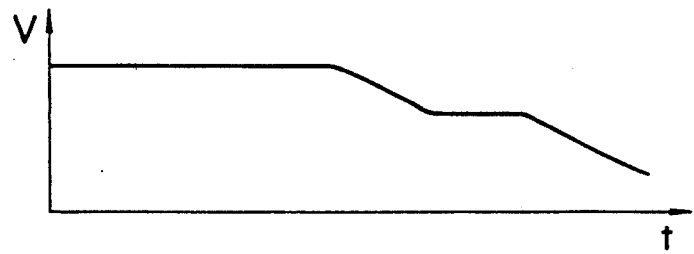
Figure 3E:
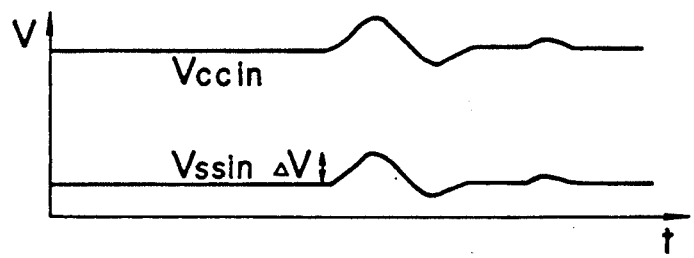
Figure 3F:
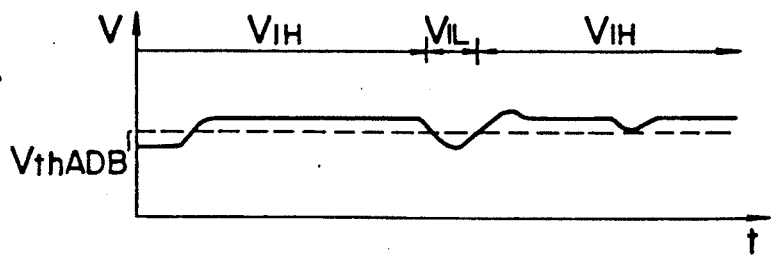
Figure 4A:
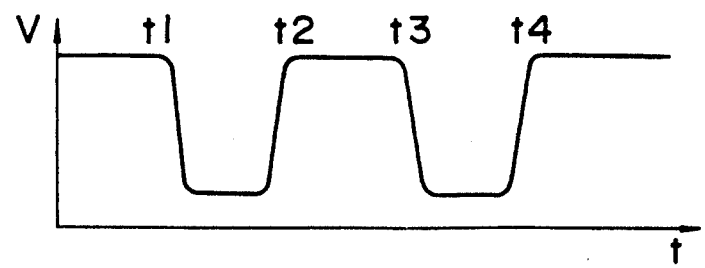
Figure 4B:
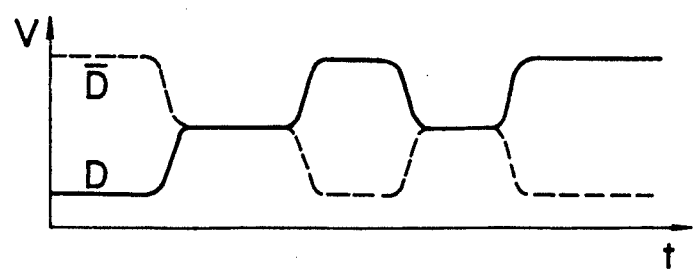
Figure 4C:
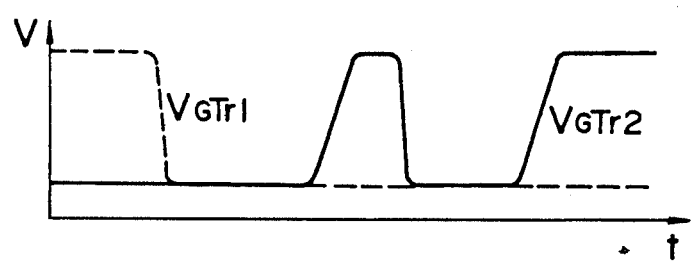
Figure 4D:
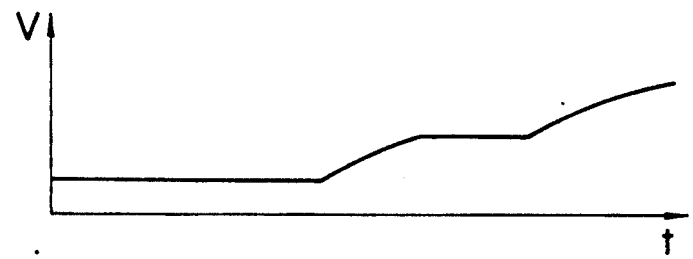
Figure 4E:
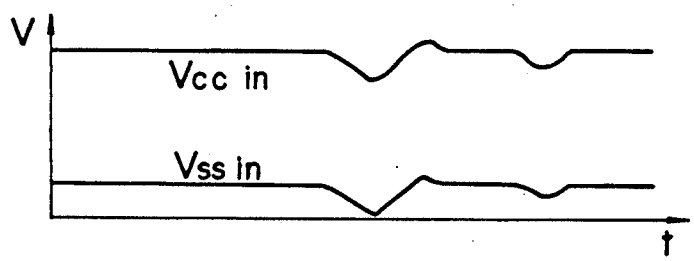
Figure 4F:
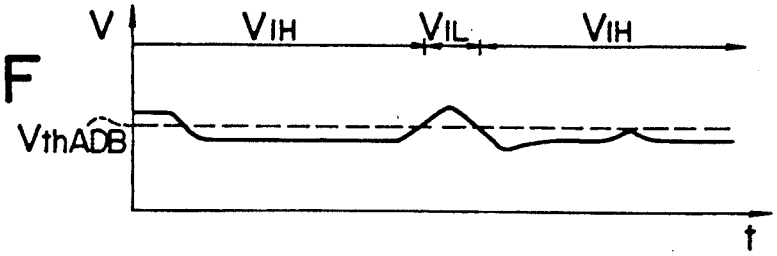
Figure 5A:
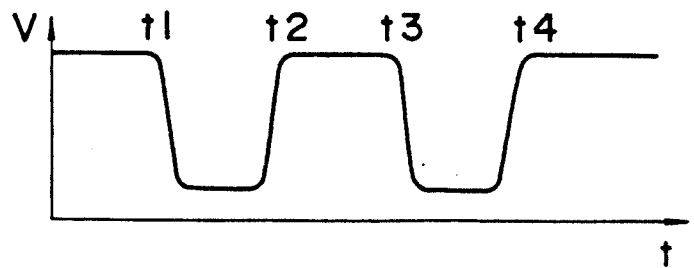
FIGS. 5A to 5F and FIGS. 6A to 6F are timing charts used for explaining the operation of the semiconductor device shown in FIG. 2.
Figure 5B:
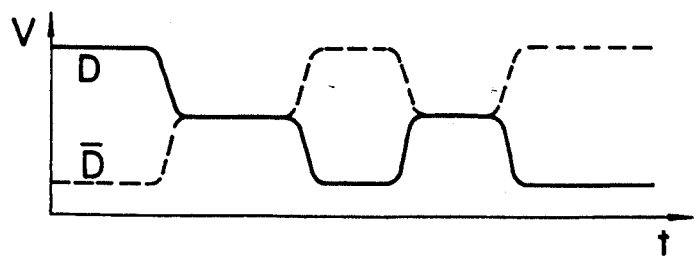
Figure 5C:
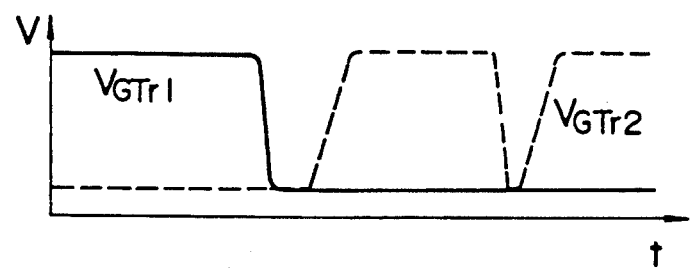
Figure 5D:
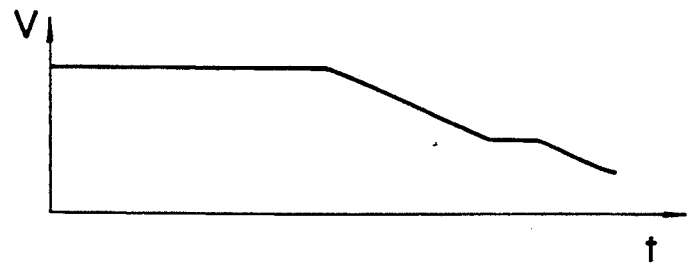
Figure 5E:
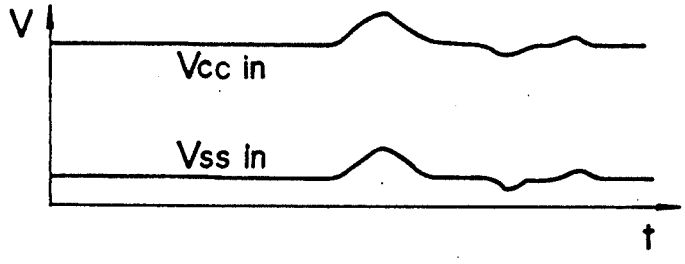
Figure 5F:
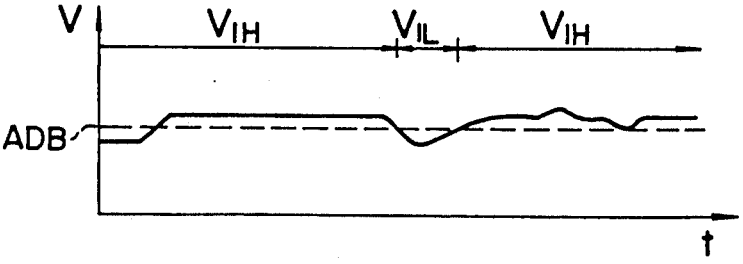
Figure 6A:
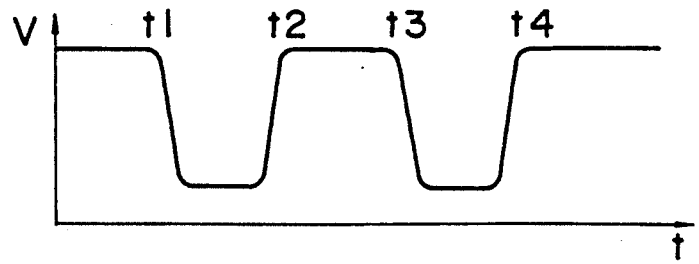
Figure 6B:
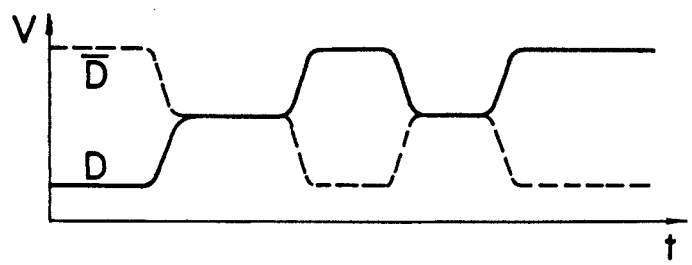
Figure 6C:
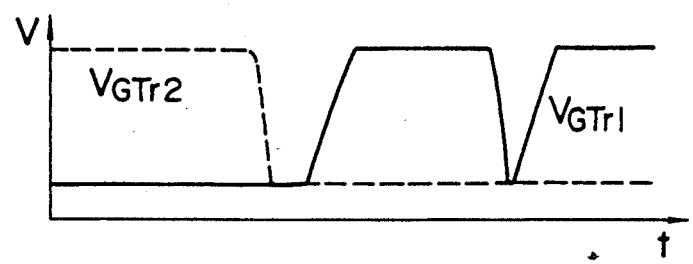
Figure 6D:
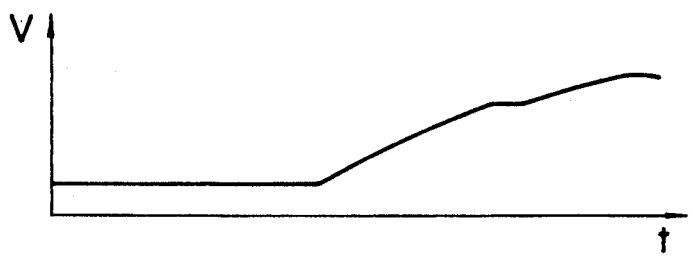
Figure 6E:
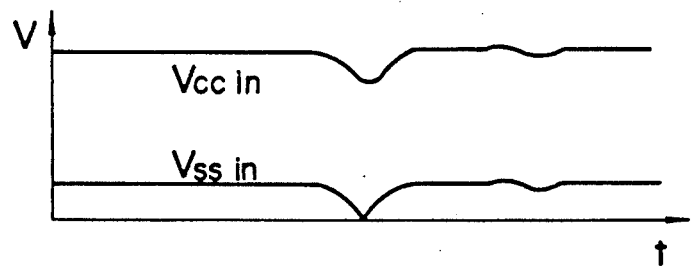
Figure 6F:
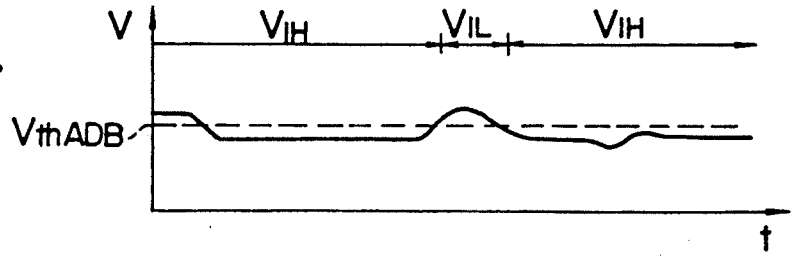
Figure 7:
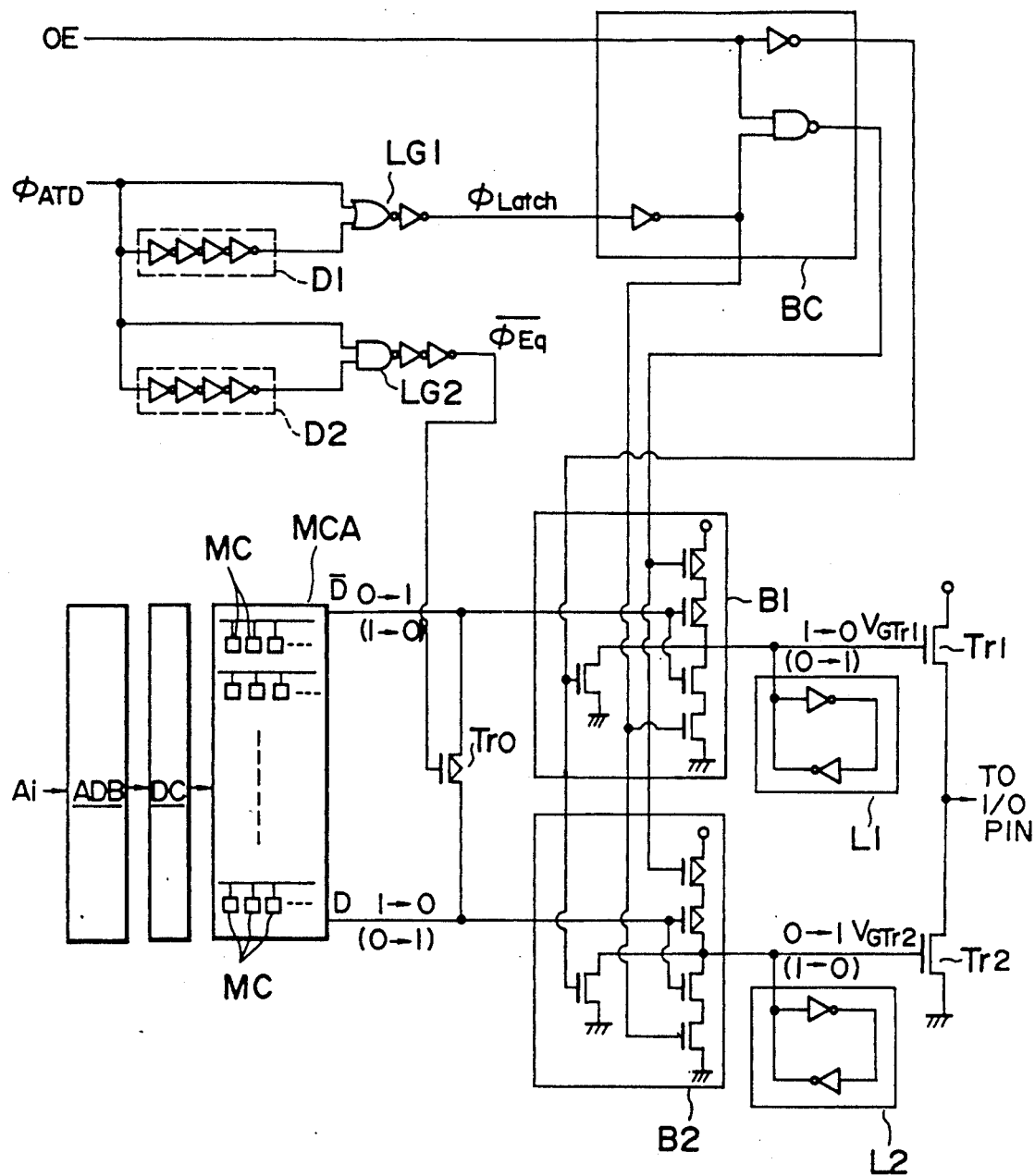
FIG. 7 is a block diagram of a semiconductor device according to an embodiment of this invention.

FIG. 7 is a circuit diagram of the embodiment of this invention. Referring to FIG. 7, an address Ai is supplied via an address buffer ADB to a decoder DC by which the address is decoded The decoded signal selects one memory cell MC within a memory cell array MCA. The selected memory cell MC outputs complementary data corresponding to the stored data onto data lines D and $\overline{D}$. An address transition detection pulse $\phi_{ATD}$ is applied directly to logical circuits LG1 and LG2, and via first and second delay circuits D1 and D2 to the same logical circuits LG1 and LG2. The logical circuits LG1 and LG2 output data output buffer control signal $\phi_{Latch}$ and equalizing signal $\overline{\phi}_{Eq}$ each having a different time duration. The data output buffer control signal $\phi_{Latch}$ together with an output enable signal OE is inputted to a buffer control circuit BC which supplies control signals to tri-state output buffer circuits B1 and B2. The equalizing signal $\overline{\phi}_{Eq}$ is applied to the gate of an equalizing transistor Tr0. The other structure is substantially the same as that shown in FIG. 2, and identical reference numerals are given to those similar elements.

Next, the operation of the embodiment constructed as above will be described.

Figure 8A:
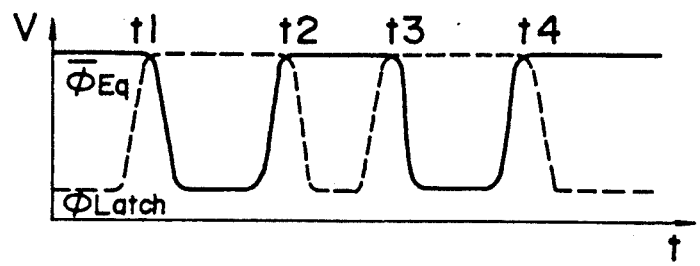
FIGS. 8A to 8F and FIGS. 9A to 9F are timing charts used for explaining the operation of the semiconductor device shown in FIG. 7.
Figure 8B:
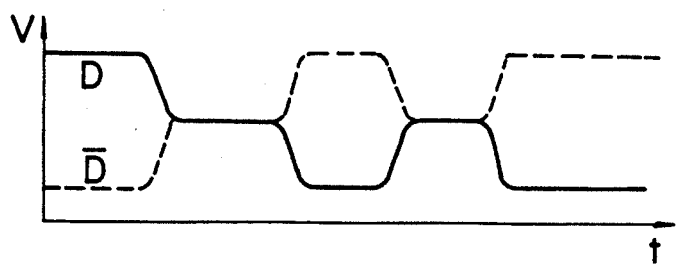
Figure 8C:
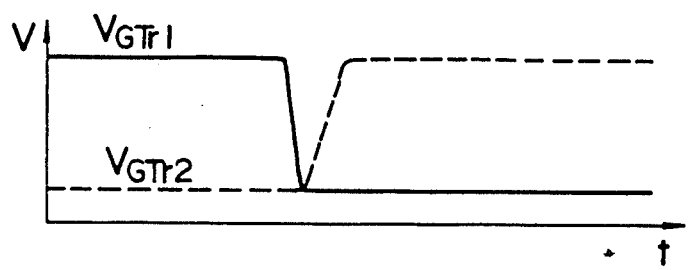
Figure 8D:
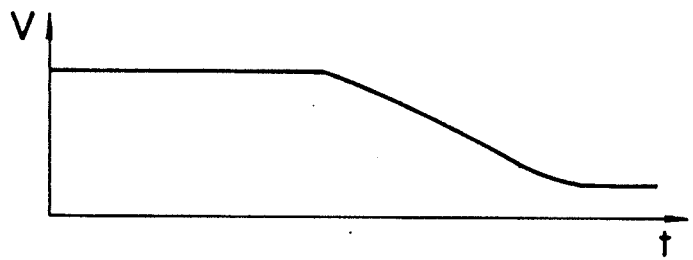
Figure 8E:
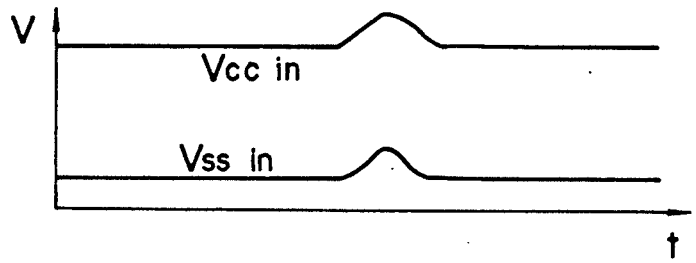

First, the circuit operation of the semiconductor device shown in FIG. 7 for reading the "0" level to be changed from the "1" level from a memory cell MC will be described with reference to the timing charts shown in FIGS. 8A to 8F. FIG. 8A shows a change in potential of the equalizing signal $\overline{\phi}_{Eq}$ and output buffer control signal $\phi_{Latch}$ with time, FIG. 8B shows a change in potential of the data lines D and $\overline{D}$ with time, FIG. 8C shows a change in gate potential of the output transistors Tr1 and Tr2 with time, FIG. 8D shows a change in potential at the I/O pin connected to the interconnection between the output transistors Tr1 and Tr2 with time, FIG. 8E shows a change in $V_{CCin}$ and $V_{SSin}$ within the chip of the semiconductor circuit, and FIG. 8F shows a change in potential of the external input to an address buffer from the outside of the chip with time, relative to the reference potential of $V_{SSin}$ within the semiconductor circuit.

Figure 8F:
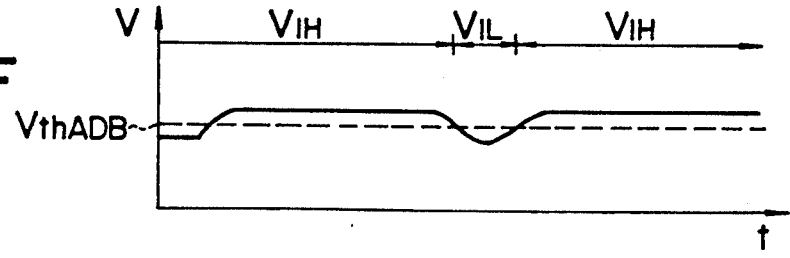

As shown in FIG. 8F, consider the case where an input signal (address) Ai to the address buffer ADB changes from a lower voltage to a higher voltage than a threshold value $V_{thADB}$ of the buffer circuit ADB. When the address buffer circuit ADB operates, the address transition detection signal $\phi_{ATD}$ temporarily takes the "1" level at time t1 so that the control signal $\phi_{Latch}$ temporarily takes the "1" level whereas the equalizing signal $\overline{\phi}_{Eq}$ temporarily takes the "0" level.

The timings of these signals are set as in the following manner. When the address transition detection signal $\phi_{ATD}$ changes from the "0" level to the "1" level, the control signal $\phi_{Latch}$ first changes from the "0" level to the "1" level and the equalizing signal $\overline{\phi}_{Eq}$ then changes from the "1" level to the "0" level, by means of the first and second delay circuits D1 and D2 and logical circuits LG1 and LG2. On the other hand, when the address transition detection signal $\phi_{ATD}$ changes from the "1" level to the "0" level, the equalizing signal $\overline{\phi}_{Eq}$ first changes from the "0" level to the "1" level and the data output buffer control signal $\phi_{Latch}$ then changes from the "1" level to the "0" level, by means of the circuits D1, D2, LG1, and LG2.

With the timings being set as above, the control signal $\phi_{Latch}$ changes from the "0" level to the "1" level before the data lines D and $\overline{D}$ are equalized and take an intermediate level. As a result, the output buffer circuits B1 and B2 enter a high impedance state so that the gate potentials $V_{GTr1}$ and $V_{GTr2}$ of output transistors Tr1 and Tr2 are held at the "1" level and the "0" level, respectively, by means of latch circuits L1 and L2. The high impedance state of the output buffer circuits B1 and B2 continues up to time t2 when the equalizing signal $\overline{\phi}_{Eq}$ changes to the "1" level and the control signal $\phi_{Latch}$ changes to the "0" level. When the control signal $\phi_{Latch}$ takes the "0" level, the output buffer circuits B1 and B2 enter a low impedance state. At this time, a newly-read out data reaches the data lines D and $\overline{D}$, the former taking the "0" level and the latter taking the "1" level. Accordingly, the gate signal $V_{GTr1}$ of the output transistor Tr1 changes from the "1" level to the "0" level, whereas the gate signal $V_{GTr2}$ of the output transistor Tr2 changes from the "0" level to the "1" level.

A large current therefore flows from the I/O pin to the inside of the semiconductor circuit chip, resulting in a temporal rise of the power supply voltages $V_{CCin}$ and $V_{SSin}$ within the chip by $\Delta V$. Accordingly, the potential $V_{in}$ of the input signal to the address buffer has a potential difference from the voltage $V_{SSin}$ within the chip, i.e., becomes higher than the latter by $\Delta V$, as compared with the case before the large current flows from the I/O pin to the inside of the semiconductor circuit chip. If the input potential $V_{in}$ has at first a potential higher than the address buffer circuit threshold value $V_{thADB}$ by the amount smaller $\Delta V$, the address buffer ADB falsely and temporarily considers the input potential as $V_{IL}$, resulting in an erroneous operation. Therefore, temporarily at time t3 the equalizing signal $\overline{\phi}_{Eq}$ again takes the "0" level and the control signal $\phi_{Latch}$ takes the "1" level.

However, as described previously, the control signal $\phi_{Latch}$ takes a "1" level while the equalizing signal $\overline{\phi}_{Eq}$ takes the "0" level. Therefore, the output buffer circuits B1 and B2 are in a high impedance state so that the gate potentials $V_{GTr1}$ and $V_{GTr2}$ of the output transistors Tr1 and Tr2 are held at the "0" level and the "1" level, respectively, by the latch circuits L1 and L2. Furthermore, when the control signal $\phi_{Latch}$ takes the "0" level at time t4, a data again reaches the data lines D and $\overline{D}$, the former taking the "0" level and the latter taking the "1" level. As a result, the gate potentials $V_{GTr1}$ and $V_{GTr2}$ of the output transistors Tr1 and Tr2 do not change. Consequently, it is possible to prevent the gate potential of the output transistor Tr2 from temporarily taking the "0" level and prevent a discharge current from flowing in the inside of the chip via the transistor Tr2, posing no problem such as a delay in data reading time.

Figure 9A:
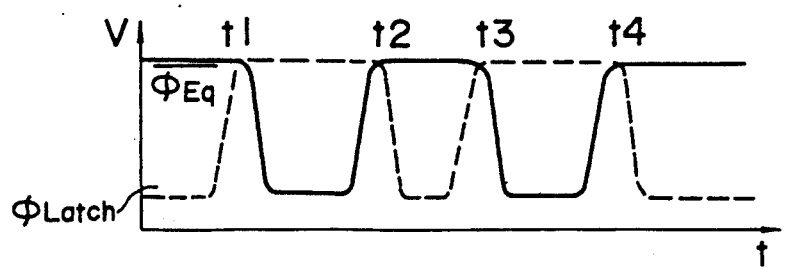
Figure 9B:
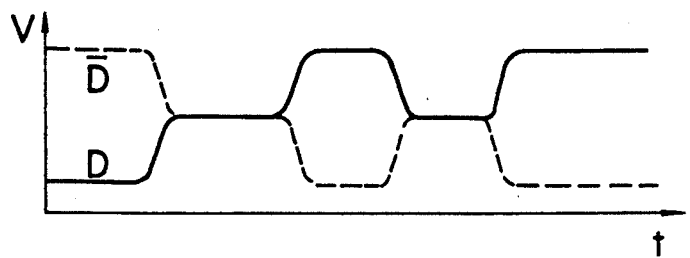
Figure 9C:
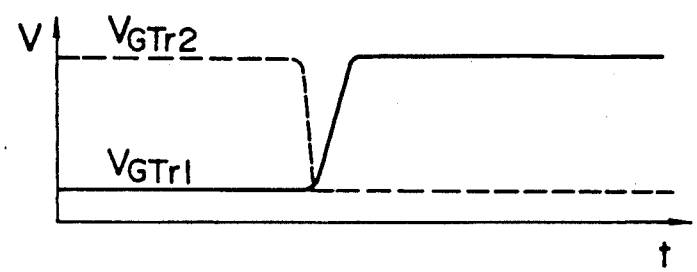
Figure 9D:
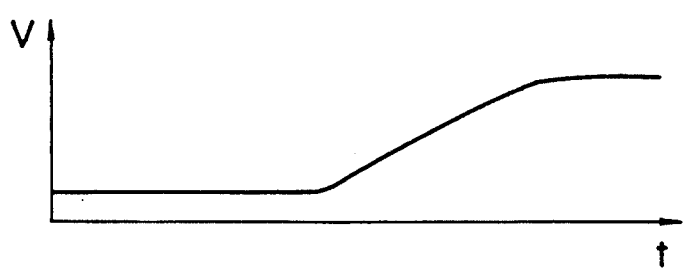
Figure 9E:
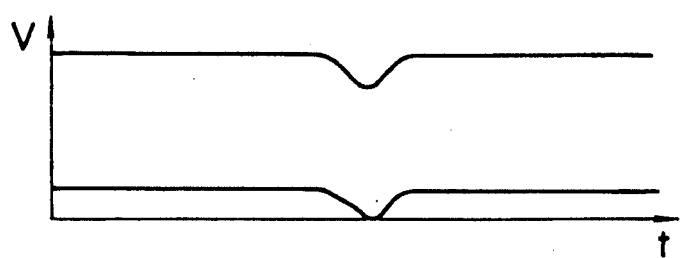

Next, the circuit operation of the semiconductor device shown in FIG. 7 for reading the "1" level to be changed from the "0" level from a memory cell MC will be described with reference to the timing charts shown in FIGS. 9A to 9F. FIG. 9A shows a change in potential of the equalizing signal $\overline{\phi}_{Eq}$ and output buffer control signal $\phi_{Latch}$ with time, FIG. 9B shows a change in potential of the data lines D and $\overline{D}$ with time, FIG. 9C shows a change in gate potential of the output transistors Tr1 and Tr2 with time, FIG. 9D shows a change in potential at the I/O pin connected to the interconnection between the output transistors Tr1 and Tr2 with time, FIG. 9E shows a change in $V_{CCin}$ and $V_{SSin}$ within the chip Of the semiconductor circuit, and FIG. 9F shows a change in potential of the external input to an address buffer from the outside of the chip with time, relative to the reference potential of $V_{SSin}$ within the semiconductor circuit.

Figure 9F:
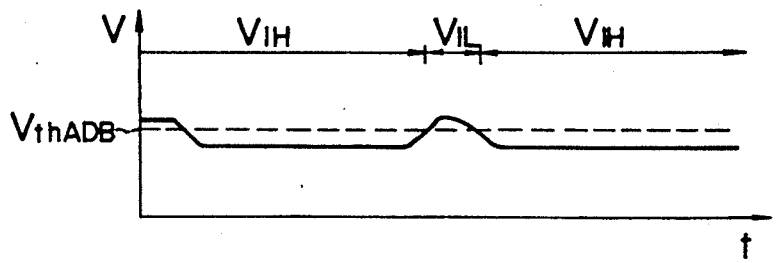

As shown in FIG. 9F, consider the case where an input signal (address) Ai to the address buffer ADB changes from a higher voltage to a lower voltage than a threshold value $V_{thADB}$ of the buffer circuit ADB. When the address buffer circuit ADB operates, the address transition detection signal $\phi_{ATD}$ temporarily takes the "1" level at time t1 so that the data output buffer control signal $\phi_{Latch}$ temporarily takes the "1" level whereas the equalizing signal $\overline{\phi}_{Eq}$ temporarily takes the "0" level.

The timings of these signals are set in the following manner in the similar manner described above When the address transition detection signal $\phi_{ATD}$ changes from the "0" level to the "1" level, the control signal $\phi_{Latch}$ first changes from the "0" level to the "1" level and the equalizing signal $\overline{\phi}_{Eq}$ then changes from the "1" level to the "0" level, by means of the first and second delay circuits D1 and D2 and logical circuits LG1 and LG2. On the other hand, when the address transition detection signal $\phi_{ATD}$ changes from the "1" level to the "0" level, the equalizing signal $\overline{\phi}_{Eq}$ first changes from the "0" level to the "1" level and the data output buffer control signal $\phi_{Latch}$ then changes from the "1" level to the "0" level.

With the timings being set as above, the control signal $\phi_{Latch}$ changes from the "0" level to the "1" level before the data lines D and $\overline{D}$ are equalized and take an intermediate level. As a result, the output buffer circuits B1 and B2 enter a high impedance state so that the gate potentials $V_{GTr1}$ and $V_{GTr2}$ of the output transistors Tr1 and Tr2 are held at the "1" level and the "0" level, respectively, by means of the latch circuits L1 and L2. The high impedance state of the output buffer circuits B1 and B2 continues up to time t2 when the equalizing signal $\overline{\phi}_{Eq}$ changes to the "1" level and the control signal $\phi_{Latch}$ changes to the "0" level. When the control signal $\phi_{Latch}$ takes the "0" level, the output buffer circuits B1 and B2 enter a low impedance state. At this time, a newly-read out data reaches the data lines D and $\overline{D}$, the former taking the "1" level and the latter taking the "0" level. Accordingly, the gate signal $V_{GTr1}$ of the output transistor Tr1 changes from the "0" level to the "1" level, whereas the gate signal $V_{GTr2}$ of the output transistor Tr2 changes from the "1" level to the "0" level.

A large current therefore flows from the inside of the semiconductor circuit chip to the I/O pin via the transistor Tr1, resulting in a temporal fall of the power supply voltages $V_{CCin}$ and $V_{SSin}$ within the chip by $\Delta V$. Accordingly, the potential $V_{in}$ of the input signal to the address buffer has a potential difference from the voltage $V_{SSin}$ within the chip, i.e., becomes higher than the latter by $\Delta V$, as compared with the case before the large current flows from the I/O pin to the inside of the semiconductor circuit chip. If the input potential $V_{in}$ has at first a potential lower than the address buffer circuit threshold value $V_{thADB}$ by the amount smaller than $\Delta V$, the address buffer ADB falsely and temporarily considers the input potential as $V_{IH}$, resulting in an erroneous operation. Therefore, temporarily at time t3 the equalizing signal $\overline{\phi}_{Eq}$ again takes the "0" level and the control signal $\phi_{Latch}$ takes the "1" level.

However, as described previously, the data output buffer control signal $\phi_{Latch}$ takes the "1" level while the equalizing signal $\overline{\phi}_{Eq}$ takes the "0" level. Therefore, the output buffer circuits B1 and B2 are in a high impedance state so that the gate potentials $V_{GTr1}$ and $V_{GTr2}$ of the output transistors Tr1 and Tr2 are held at the "0" level and the "1" level, respectively, by the latch circuits L1 and L2. Furthermore, when the control signal $\phi_{Latch}$ takes the "0" level at time t4, a data again reaches the data lines D and $\overline{D}$, the former taking the "1" level and the latter taking the "0" level. As a result, the gate potentials $V_{GTr1}$ and $V_{GTr2}$ of the output transistors Tr1 and Tr2 do not change. Consequently, it is possible to prevent the gate potential of the output transistor Tr2 from temporarily taking the "0" level and prevent a charge current from flowing from the inside of the chip to the I/O pin, posing no problem such as a delay in data reading time.

Figure 10:
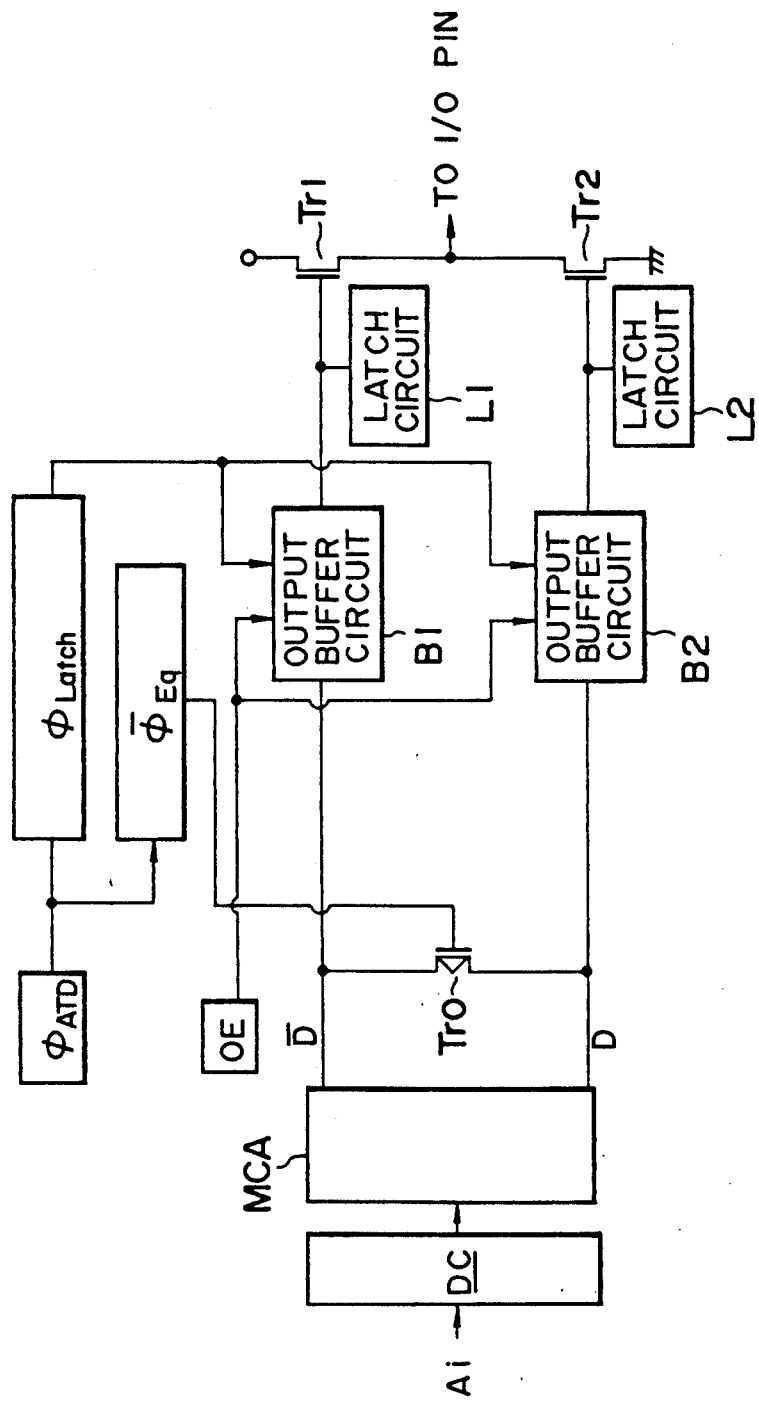
FIG. 10 is a block diagram showing the outline of the circuit structure of the semiconductor device shown in FIG. 7.

The circuit shown in FIG. 7 is schematically shown in FIG. 10 in the form of a block diagram. As seen from this block diagram, there are first generated from the address transition detection signal $\phi_{ATD}$ the control signal $\phi_{Latch}$ and the equalizing signal $\overline{\phi}_{Eq}$ having the timings of the rising and falling edges as shown. The control signal $\phi_{Latch}$ is supplied to the tri-state output buffer circuits B1 and B2. The equalizing signal $\overline{\phi}_{Eq}$ is supplied to the transistor Tr0. The data on the data lines D and D is supplied via the output buffer circuits B1 and B2 to the gates of the output transistors Tr1 and Tr2. The latch circuits L1 and L2 are connected to the gates of the output transistors Tr1 and Tr2. The latch circuits L1 and L2 hold the gate potentials only when the output buffer circuits B1 and B2 are in a high impedance state.

As described so far, according to the embodiments of this invention, the output buffer circuits enter a high impedance state before the data lines are equalized. After the end of the equalization, the output buffer circuits enter a low impedance state. As a result, it is possible to provide a semiconductor device capable of preventing a delay of data reading time.

What is claimed is:

1. A semiconductor memory device comprising:
    a memory cell array having a plurality of memory cells, each of the cells being capable of storing a data and being selected by an address;
    a pair of data lines to which a pair of complementary data from a selected memory cell are inputted;
    equalizing means for short-circuiting and equalizing said pair of data lines when an equalizing signal is applied;
    output means for outputting a single signal corresponding to said pair of complementary data from said pair of data lines;
    a pair of latch means provided between said output means and said equalizing means for said pair of data lines, said pair of latch means holding said pair of complementary data;
    a pair of output buffer means provided between said pair of latch means and said equalizing means for said pair of data lines, said pair of output buffer means capable of taking a low impedance state wherein the potentials per se of said pair of data lines are outputted, and a high impedance state wherein the potential change of said pair of data lines is not transmitted to the output side of said pair of output buffer means; and
    control means for generating a first control signal which makes said pair of output buffer means to enter said high impedance state before said equalizing signal is applied to said equalizing means and a second control signal which makes said pair of output buffer means to enter said low impedance state after said equalizing signal is turned off.

2. A semiconductor memory device according to claim 1, wherein said control means includes a circuit for receiving an address transition detection signal generated when said address transits, outputting said equalizing signal after said first control signal is outputted, and thereafter turning off said second control signal after said equalizing signal is turned off.

3. A semiconductor memory device according to claim 1, wherein said equalizing means is a control element connected between said pair of data lines for short-circuiting said pair of data lines when said equalizing signal is applied to an equalizing control terminal.

4. A semiconductor memory device according to claim 2 wherein said equalizing means is a control element connected between said pair of data lines for short-circuiting said pair of data lines when said equalizing signal is applied to an equalizing control terminal.

5. A semiconductor memory device according to claim 1, wherein said output means includes first and second control elements serially connected between a high voltage side power supply terminal and a low voltage side power supply terminal, a control terminal of said first control element is connected to an output terminal of one of said pair of latch means, and a control terminal of said second control element is connected to an output terminal of the other of said pair of latch means.

6. A semiconductor memory device according to claim 2, wherein said output means includes first and second control elements serially connected between a high voltage side power supply terminal and a low voltage side power supply terminal, a control terminal of said first control element is connected to an output terminal of one of said pair of latch means, and a control terminal of said second control element is connected to an output terminal of the other of said pair of latch means.

7. A semiconductor memory device according to claim 3, wherein said output means includes first and second control elements serially connected between a high voltage side power supply terminal and a low voltage side power supply terminal, a control terminal of said first control element is connected to an output terminal of one of said pair of latch means, and a control terminal of said second control element is connected to an output terminal of the other of said pair of latch means.

8. A semiconductor memory device according to claim 4, wherein said output means includes first and second control elements serially connected between a high voltage side power supply terminal and a low voltage side power supply terminal, a control terminal of said first control element is connected to an output terminal of one of said pair of latch means, and a control terminal of said second control element is connected to an output terminal of the other of said pair of latch means.

9. A semiconductor memory device according to claim 1, wherein said output buffer means is a tri-state buffer which takes said high impedance state when said first control signal is applied, and takes said low impedance state when said second control signal is applied and outputs one of low and high level signals on said pair of data lines.

10. A semiconductor memory device according to claim 2, wherein said output buffer means is a tri-state buffer which takes said high impedance state when said first control signal is applied, and takes said low impedance state when said second control signal is applied and outputs one of low and high level signals on said pair of data lines.

11. A semiconductor memory device according to claim 5, wherein said output buffer means is a tri-state buffer which takes said high impedance state when said first control signal is applied, and takes said low impedance state when said second control signal is applied and outputs one of low and high level signals on said pair of data lines.

12. A semiconductor memory device according to claim 6, wherein said output buffer means is a tri-state buffer which takes said high impedance state when said first control signal is applied, and takes said low impedance state when said second control signal is applied and outputs one of low and high level signals on said pair of data lines.

* * * * *